US012652895B2

(12) United States Patent
Miyazaki

(10) Patent No.: US 12,652,895 B2
(45) Date of Patent: Jun. 9, 2026

(54) LIGHT EMITTING DIODE WIRED TO ZENER DIODE

(71) Applicant: ROHM Co., LTD., Kyoto (JP)

(72) Inventor: Dai Miyazaki, Kyoto (JP)

(73) Assignee: ROHM Co., LTD., Kyoto (JP)

( * ) Notice: Subject to any disclaimer, the term of this patent is extended or adjusted under 35 U.S.C. 154(b) by 643 days.

(21) Appl. No.: 18/062,200

(22) Filed: Dec. 6, 2022

(65) Prior Publication Data

US 2023/0187595 A1 Jun. 15, 2023

(30) Foreign Application Priority Data

Dec. 9, 2021 (JP) ................................. 2021-200101

(51) Int. Cl.
*H10H 20/857* (2025.01)
*H10H 29/20* (2026.01)
*H10H 29/80* (2025.01)
*H10H 29/85* (2025.01)

(52) U.S. Cl.
CPC .......... *H10H 20/857* (2025.01); *H10H 29/20* (2025.01); *H10H 29/8321* (2025.01); *H10H 29/8506* (2025.01); *H10H 29/8508* (2025.01); *H10H 29/857* (2025.01)

(58) Field of Classification Search
CPC .............................. H01L 25/167; H10H 29/20
See application file for complete search history.

(56) References Cited

U.S. PATENT DOCUMENTS

| | | | | |
|---|---|---|---|---|
| 6,054,716 A | * | 4/2000 | Sonobe ................. | H01L 25/167 |
| | | | | 250/552 |
| 2003/0189201 A1 | * | 10/2003 | Chen .................... | H01L 25/167 |
| | | | | 257/E25.032 |
| 2020/0225352 A1 | * | 7/2020 | Stassar .................. | H04B 10/11 |

FOREIGN PATENT DOCUMENTS

| | | |
|---|---|---|
| CN | 210429810 U | 4/2020 |
| JP | 2011-222544 A | 11/2011 |
| JP | 2014007355 | 1/2014 |
| JP | 2014-103365 A | 6/2014 |
| JP | 2021-052143 A | 4/2021 |

OTHER PUBLICATIONS

Office Action for corresponding Japanese Application JP2021-200101 mailed Oct. 28, 2025.

* cited by examiner

*Primary Examiner* — Kevin Parendo
(74) *Attorney, Agent, or Firm* — CHIP LAW GROUP

(57) ABSTRACT

Disclosed herein is a semiconductor light emitting device including a semiconductor light emitting element, a Zener diode, and a conductive support component that supports the semiconductor light emitting element and the Zener diode. The semiconductor light emitting element has a first electrode. The semiconductor light emitting device further includes a first wire connected to the Zener diode and the first electrode.

12 Claims, 9 Drawing Sheets

F I G . 4
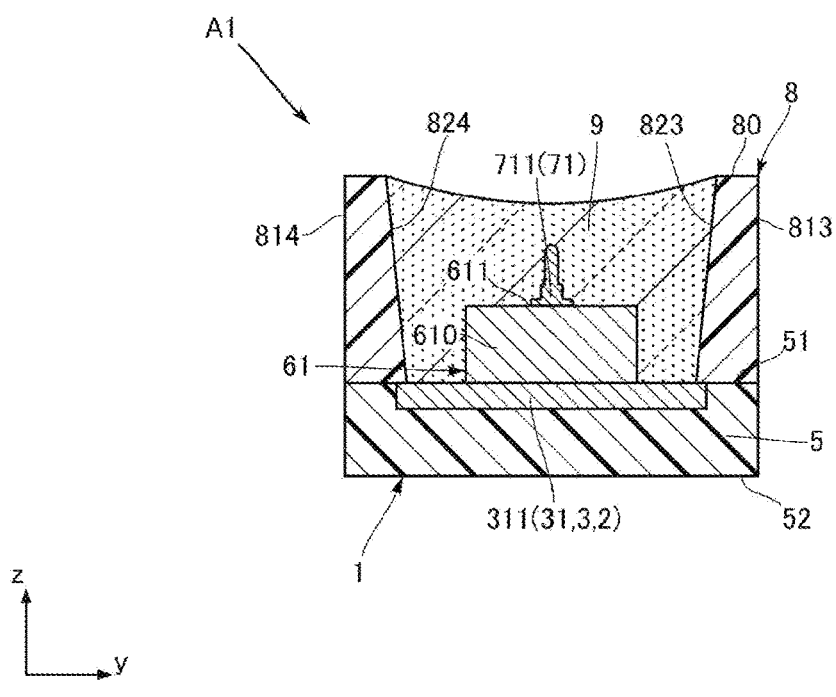
F I G . 5
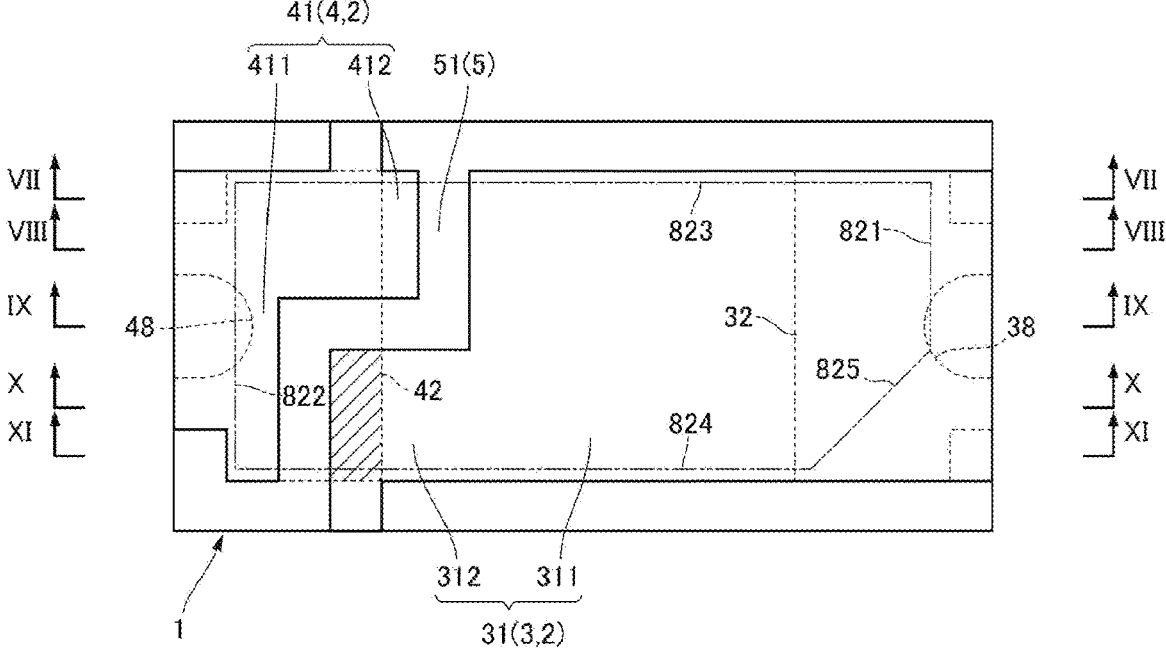
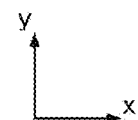

F I G . 1 8
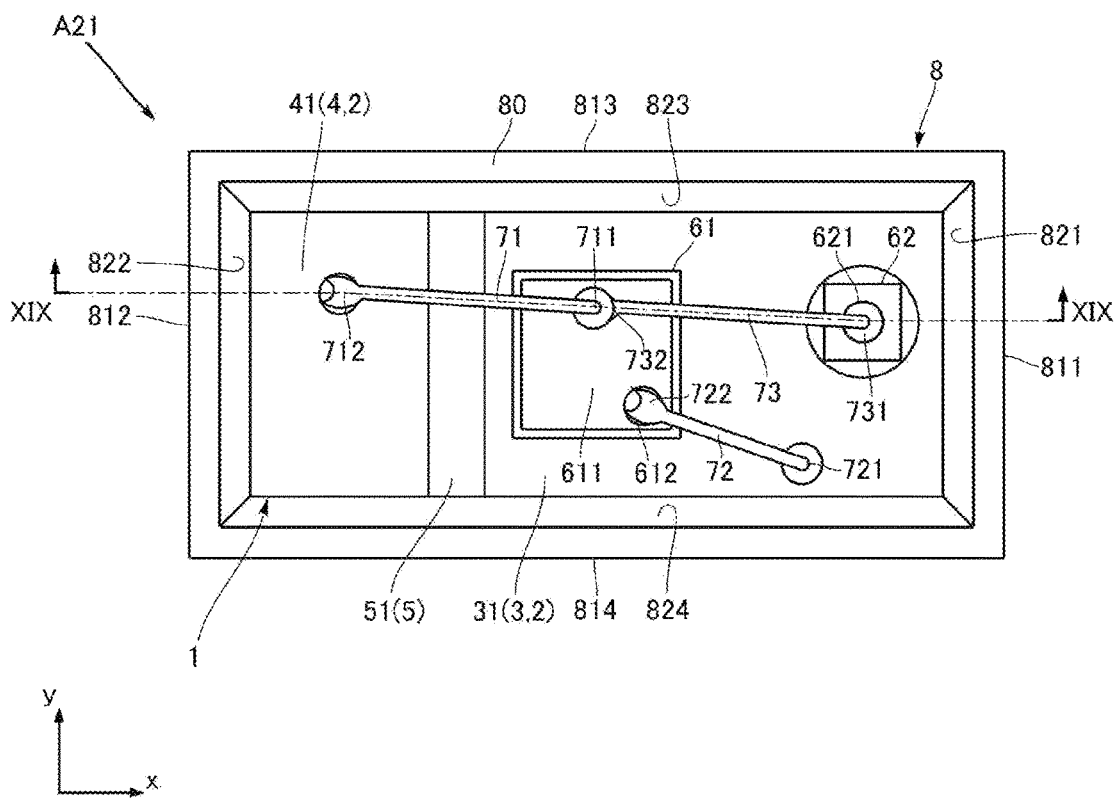
F I G . 1 9
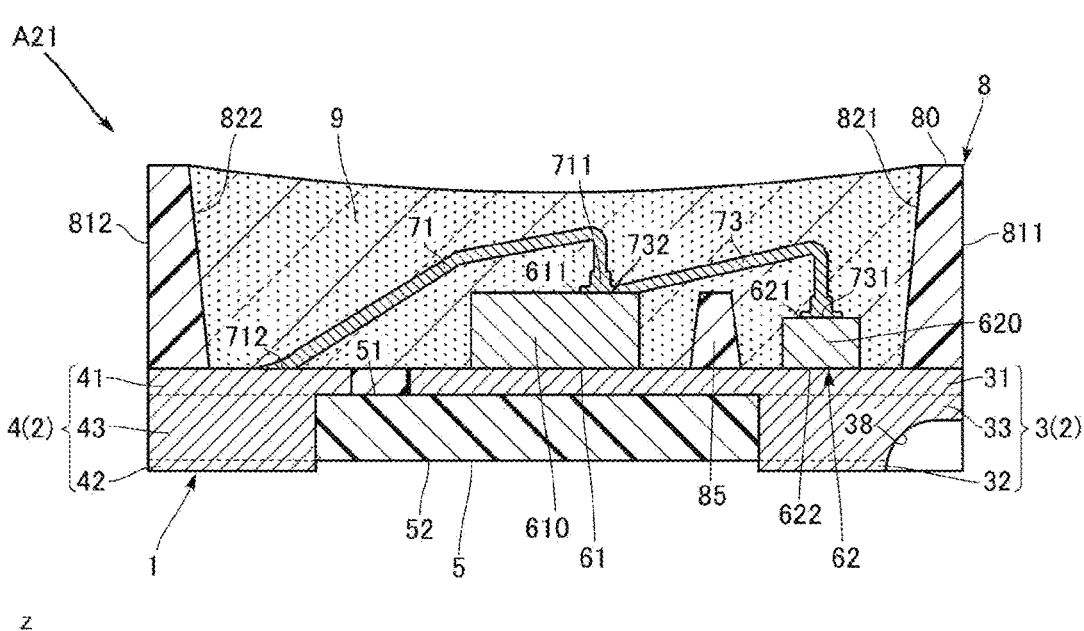
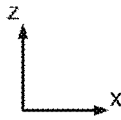

LIGHT EMITTING DIODE WIRED TO ZENER DIODE

CROSS REFERENCE TO RELATED APPLICATIONS

This application claims priority benefit of Japanese Patent Application No. JP 2021-200101 filed in the Japan Patent Office on Dec. 9, 2021. Each of the above-referenced applications is hereby incorporated herein by reference in its entirety.

BACKGROUND

The present disclosure relates to a semiconductor light emitting device.

Semiconductor light emitting devices using a light emitting diode (LED) chip as a light source are widely prevalent. In Japanese Patent Laid-open No. 2014-7355, one example of an existing semiconductor light emitting device is disclosed. The semiconductor light emitting device disclosed in this document includes LED chips, fluorescent parts, a lead, and a case.

SUMMARY

A demand for size reduction of the semiconductor light emitting device is strong. Further, increase in the luminance of the semiconductor light emitting device is desired.

The present disclosure is what has been devised under the above-described circumstances, and it is desirable to provide a semiconductor light emitting device allowed to intend size reduction and increase in the luminance.

A semiconductor light emitting device provided by the present disclosure includes a semiconductor light emitting element, a Zener diode, and a conductive support component that supports the semiconductor light emitting element and the Zener diode. The semiconductor light emitting element has a first electrode, and the semiconductor light emitting device further includes a first wire connected to the Zener diode and the first electrode.

According to the present disclosure, size reduction and increase in the luminance for a semiconductor light emitting device can be sought.

Other characteristics and advantages of the present disclosure will become more apparent by detailed description to be made below with reference to the accompanying drawings.

BRIEF DESCRIPTION OF THE DRAWINGS

FIG. 4 is a sectional view taken along line IV-IV in FIG. 1;

FIG. 5 is a plan view illustrating a conductive support component of the semiconductor light emitting device according to the first embodiment of the present disclosure;

FIG. 18 is a plan view illustrating a first modification example of the semiconductor light emitting device according to the second embodiment of the present disclosure; and FIG. 19 is a sectional view taken along line XIX-XIX in FIG. 18.

DETAILED DESCRIPTION OF THE PREFERRED EMBODIMENTS

Figure 1:
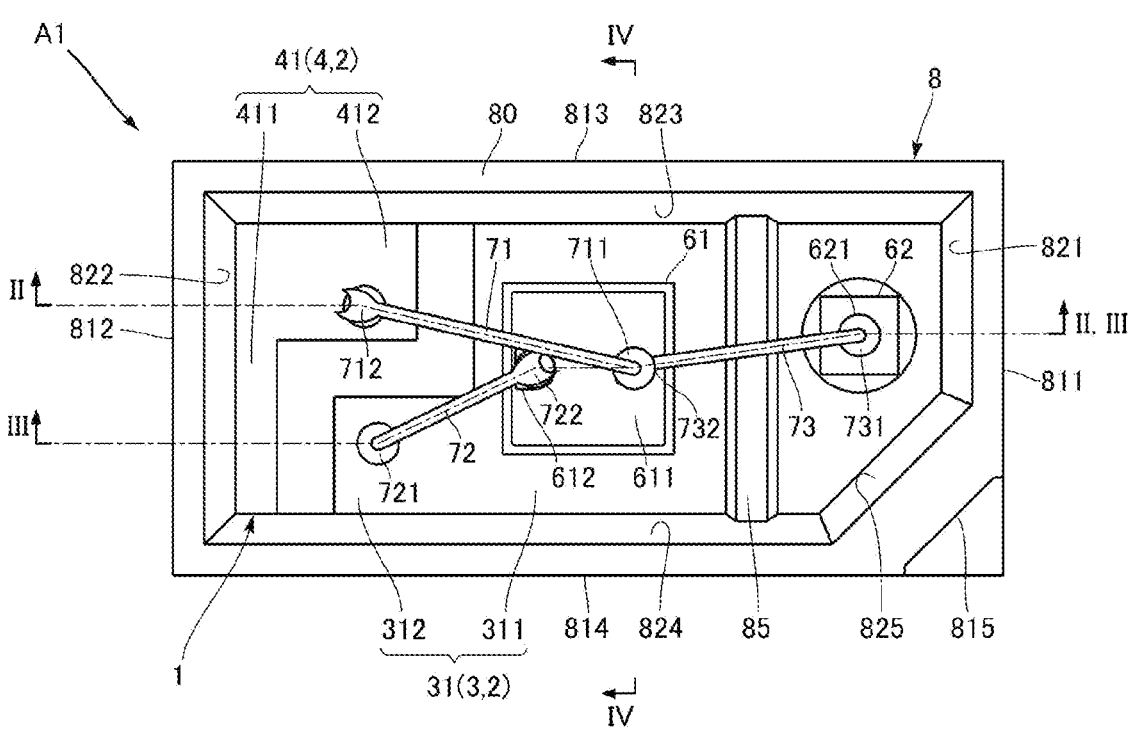
FIG. 1 is a plan view illustrating a semiconductor light emitting device according to a first embodiment of the present disclosure.
Figure 1:
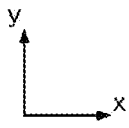

Preferred embodiments of the present disclosure will specifically be described below with reference to the drawings.

Such terms as "first," "second," and "third" in the present disclosure are each what is used merely as a label, and do not intend to order subjects to which these terms are given.

In the present disclosure, an expression "object A is formed on object B" and an expression "object A is formed over object B" each include both the case in which "object A is formed directly on object B" and the case in which "object A is formed over object B with the interposition of another object between object A and object B" unless otherwise noted. Similarly, an expression "object A is disposed on object B" and an expression "object A is formed over object B" each include both the case in which "object A is disposed directly on object B" and the case in which "object A is disposed over object B with the interposition of another object between object A and object B" unless otherwise noted. Similarly, an expression "object A is located on object B" includes the case in which "object A is in contact with object B and object A is located on object B" and the case in which "object A is located over object B with the interposition of another object between object A and object B" unless otherwise noted. Further, an expression "object A overlaps with object B as viewed in a certain direction" includes the case in which "object A overlaps with the whole of object B" and the case in which "object A overlaps with part of object B" unless otherwise noted. Moreover, in the present disclosure, an expression "surface A is oriented in direction B (or toward one side or the other side in direction B)" is not limited to the case in which the angle of surface A with respect to direction B is 90°, and includes the case in which surface A is inclined with respect to direction B.

First Embodiment

FIG. 1 to FIG. 11 each illustrate a semiconductor light emitting device according to a first embodiment of the present disclosure. A semiconductor light emitting device A1 of the present embodiment includes a conductive support component 1, a semiconductor light emitting element 61, a Zener diode 62, wires 71, 72, and 73, a case 8, and a translucent resin 9. There is no limitation on the use purpose or the like of the semiconductor light emitting device A1. For example, it is used as a light emitting device of electronic equipment or other equipment by being mounted on a circuit board of the electronic equipment.

Figure 2:
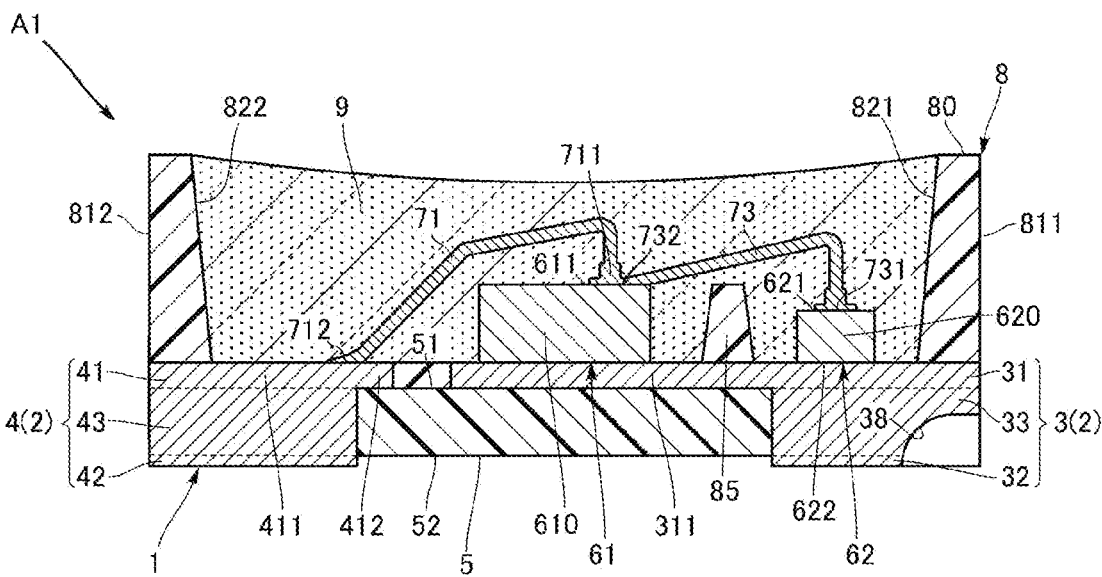
FIG. 2 is a sectional view taken along line II-II in FIG. 1.
Figure 2:
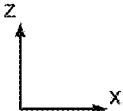
Figure 3:
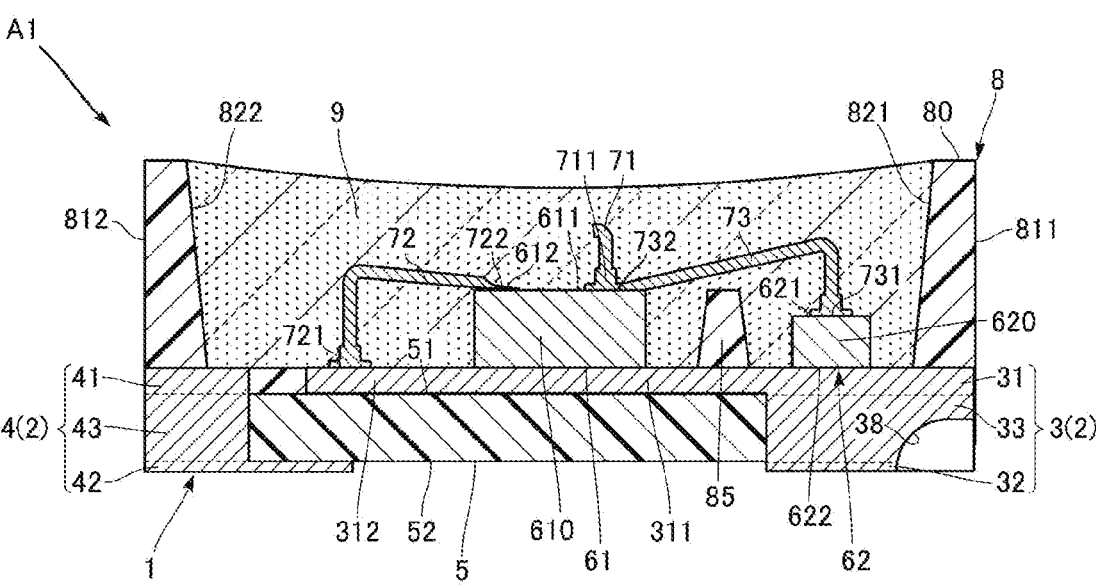
FIG. 3 is a sectional view taken along line III-III in FIG. 1.
Figure 3:
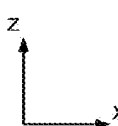
Figure 6:
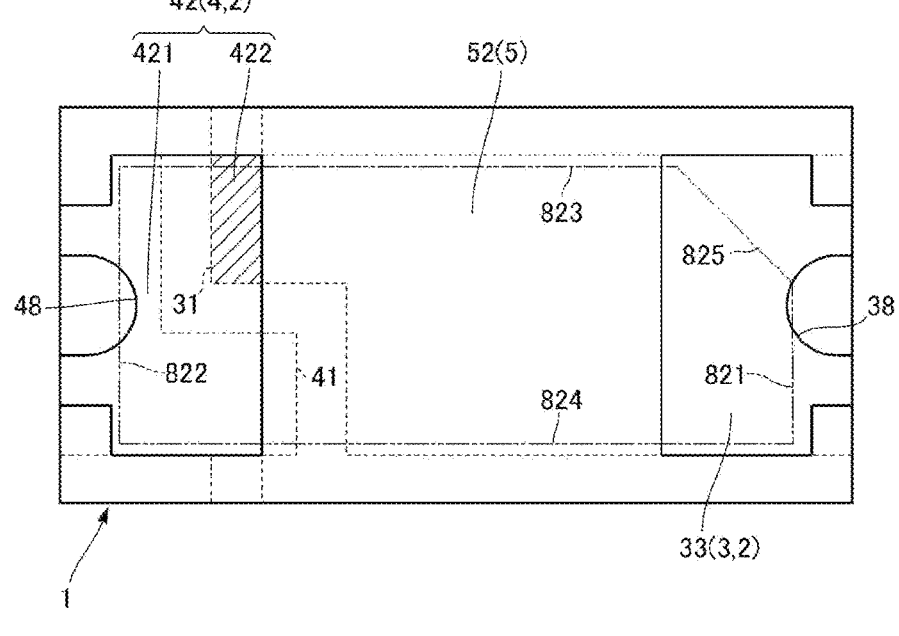
FIG. 6 is a bottom view illustrating the conductive support component of the semiconductor light emitting device according to the first embodiment of the present disclosure.
Figure 7:
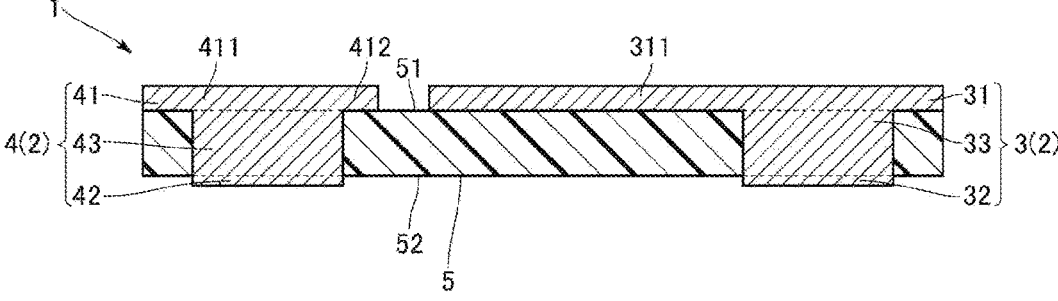
FIG. 7 is a sectional view taken along line VII-VII in FIG. 5.
Figure 8:
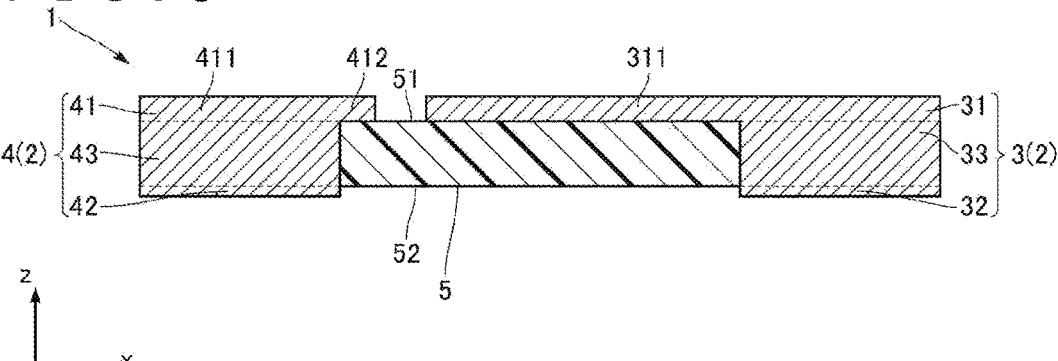
FIG. 8 is a sectional view taken along line VIII-VIII in FIG. 5.
Figure 9:
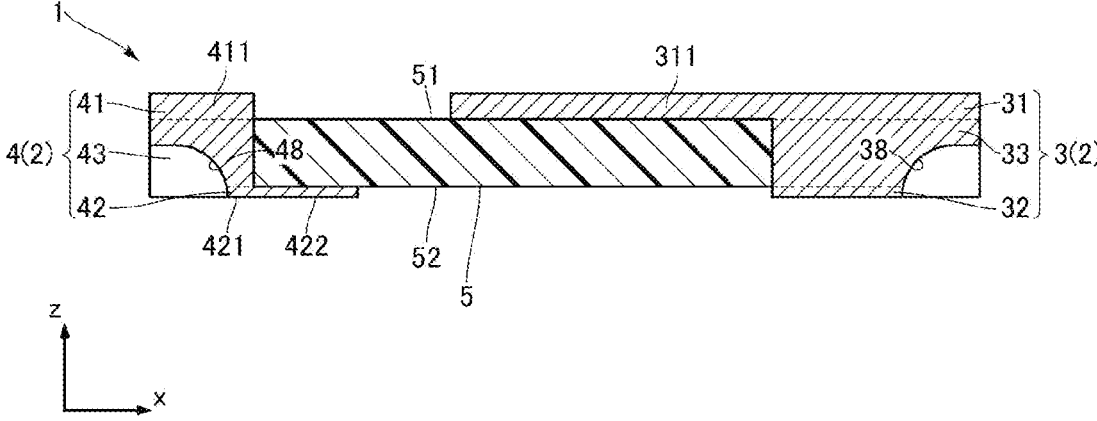
FIG. 9 is a sectional view taken along line IX-IX in FIG. 5.
Figure 10:
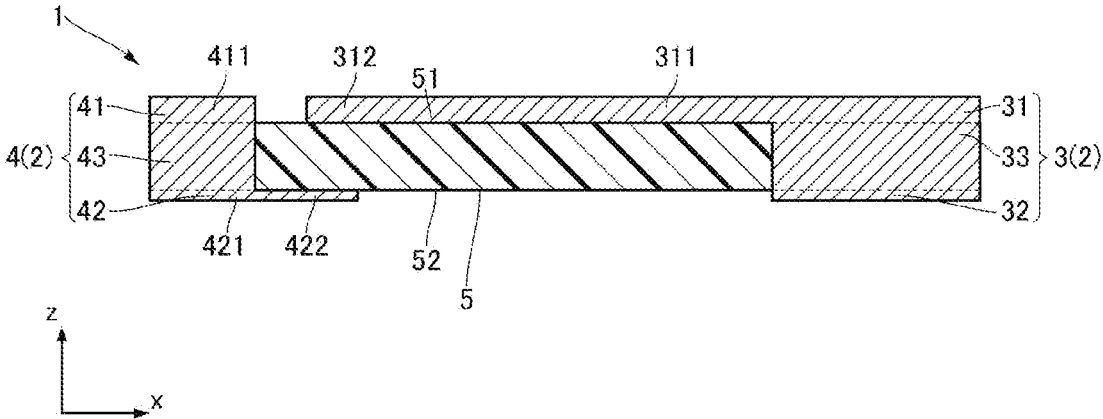
FIG. 10 is a sectional view taken along line X-X in FIG. 5.
Figure 11:
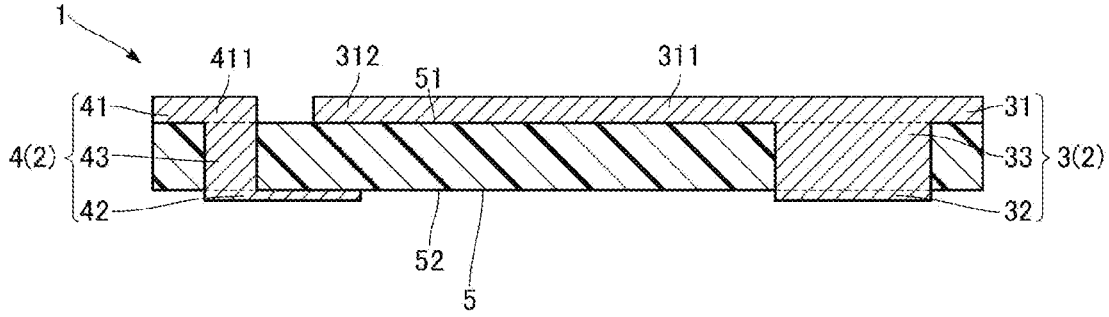
FIG. 11 is a sectional view taken along line XI-XI in FIG. 5.

FIG. 1 is a plan view illustrating the semiconductor light emitting device A1. FIG. 2 is a sectional view taken along line II-II in FIG. 1. FIG. 3 is a sectional taken view along line III-III in FIG. 1. FIG. 4 is a sectional view taken along line IV-IV in FIG. 1. FIG. 5 is a plan view illustrating the conductive support component 1 of the semiconductor light emitting device A1. FIG. 6 is a bottom view illustrating the conductive support component 1 of the semiconductor light emitting device A1. FIG. 7 is a sectional view taken along line VII-VII in FIG. 5. FIG. 8 is a sectional view taken along line VIII-VIII in FIG. 5. FIG. 9 is a sectional view taken along line IX-IX in FIG. 5. FIG. 10 is a sectional view taken along line X-X in FIG. 5. FIG. 11 is a sectional view taken along line XI-XI in FIG. 5. In these diagrams, a z direction is equivalent to the thickness direction of the present disclosure, an x direction is equivalent to the first direction of the present disclosure, and a y direction is equivalent to the second direction of the present disclosure. In FIG. 1, the translucent resin 9 is omitted for convenience of understanding.

Conductive Support Component 1

The conductive support component 1 is a component for mechanically supporting the semiconductor light emitting element 61 and is what configures a conduction path for supplying power to the semiconductor light emitting element 61. Further, in the present embodiment, the conductive support component 1 is a component for mechanically supporting the Zener diode 62 and is what configures a conduction path that conducts to the Zener diode 62. The conductive support component 1 includes an electrically-conductive part 2 and an insulating part 5.

Insulating Part 5

The insulating part 5 is a component for insulating an appropriate place in the electrically-conductive part 2. The material of the insulating part 5 is by no means limited to any kind and includes an insulating resin such as an epoxy resin, for example. As illustrated in FIG. 2 to FIG. 11, the insulating part 5 has an insulating main surface 51 and an insulating back surface 52. The insulating main surface 51 and the insulating back surface 52 are oriented toward sides opposite to each other in the z direction. The insulating main surface 51 is oriented toward one side in the z direction, and the insulating back surface 52 is oriented toward the other side in the z direction. The thickness of the insulating part 5 is 0.05 to 0.2 mm, for example.

Electrically-Conductive Part 2

The electrically-conductive part 2 configures a conduction path that conducts to the semiconductor light emitting element 61 and the Zener diode 62. Further, the electrically-conductive part 2 fulfills a function of mechanically supporting the semiconductor light emitting element 61 and the Zener diode 62. The material of the electrically-conductive part 2 is by no means limited to any kind and includes a favorable electrical conductor. As the electrical conductor, for example, copper (Cu), copper (Cu) alloy, nickel (Ni), iron (Fe), and so forth are cited. Further, a plating layer (not illustrated) containing nickel (Ni) or silver (Ag), for example, may be disposed at an appropriate place on the conductive support component 1. The electrically-conductive part 2 includes a first electrically-conductive part 3 and a second electrically-conductive part 4 as illustrated in FIG. 1 to FIG. 11.

In the present embodiment, the first electrically-conductive part 3 and the second electrically-conductive part 4 are disposed separately in the x direction. The first electrically-conductive part 3 is disposed on one side in the x direction, and the second electrically-conductive part 4 is disposed on the other side in the x direction. The first electrically-conductive part 3 and the second electrically-conductive part 4 are insulated from each other by the insulating part 5.

The first electrically-conductive part 3 includes a first main surface part 31, a first back surface part 32, and a first coupling part 33.

The first main surface part 31 is a part exposed from the insulating main surface 51 of the insulating part 5. It suffices for the first main surface part 31 to be a part exposed from the insulating main surface 51 when the conductive support component 1 is viewed from the one side in the z direction, and the first main surface part 31 may protrude from the insulating main surface 51 toward the one side in the z direction or may be flush with the insulating main surface 51. In the illustrated example, the first main surface part 31 protrudes from the insulating main surface 51 toward the one side in the z direction, and the thickness thereof in the z direction is 0.03 to 0.1 mm, for example.

In the illustrated example, the first main surface part 31 includes a first main surface base part 311 and a first main surface extending part 312. The first main surface base part 311 is located on the one side in the x direction, and the first main surface extending part 312 extends from the first main surface base part 311 toward the other side in the x direction. The size of the first main surface extending part 312 in the y direction is smaller than the size of the first main surface base part 311 in the y direction. In the illustrated example, the size of the first main surface extending part 312 in the y direction is equal to or smaller than half the size of the first main surface base part 311 in the y direction. The first main surface extending part 312 leads to the first main surface base part 311 with a bias toward one side in the y direction. The first main surface part 31 reaches the end of the conductive support component 1 (semiconductor light emitting device A1) on the one side in the x direction.

The first back surface part 32 is a part exposed from the insulating back surface 52 of the insulating part 5. It suffices for the first back surface part 32 to be a part exposed from the insulating back surface 52 when the conductive support component 1 is viewed from the other side in the z direction, and the first back surface part 32 may protrude from the insulating back surface 52 toward the other side in the z direction or may be flush with the insulating back surface 52. In the illustrated example, the first back surface part 32 protrudes from the insulating back surface 52 toward the other side in the z direction, and the thickness thereof in the z direction is 0.01 to 0.05 mm, for example.

The first coupling part 33 is located between the first main surface part 31 and the first back surface part 32 in the z direction. The first coupling part 33 is located between the insulating main surface 51 and the insulating back surface 52 of the insulating part 5 in the z direction. The first coupling part 33 couples the first main surface part 31 and the first back surface part 32. The first coupling part 33 overlaps with at least part of the first main surface part 31 and at least part of the first back surface part 32 as viewed in the z direction. The first back surface part 32 reaches the end of the conductive support component 1 (semiconductor light emitting device A1) on the other side in the x direction.

The first main surface part 31 extends from the first back surface part 32 and the first coupling part 33 toward the other side in the x direction as viewed in the z direction. The first main surface extending part 312 does not overlap with the first back surface part 32 and the first coupling part 33 as viewed in the z direction. In the illustrated example, the whole of the first back surface part 32 overlaps with the first coupling part 33 as viewed in the z direction.

In the illustrated example, the first electrically-conductive part 3 has a recessed part 38. The recessed part 38 is a part that hollows from the other side in the z direction and the one side in the x direction. Due to this, the first back surface part 32 has a shape that hollows from the one side in the x direction as viewed in the z direction.

The second electrically-conductive part 4 includes a second main surface part 41, a second back surface part 42, and a second coupling part 43.

The second main surface part 41 is a part exposed from the insulating main surface 51 of the insulating part 5. It suffices for the second main surface part 41 to be a part exposed from the insulating main surface 51 when the conductive support component 1 is viewed from the one side in the z direction, and the second main surface part 41 may protrude from the insulating main surface 51 toward the one side in the z direction or may be flush with the insulating main surface 51. In the illustrated example, the second main surface part 41 protrudes from the insulating main surface 51 toward the one side in the z direction, and the thickness thereof in the z direction is 0.03 to 0.1 mm, for example.

In the illustrated example, the second main surface part 41 includes a second main surface base part 411 and a second main surface extending part 412. The second main surface base part 411 is located on the other side in the x direction. The second main surface extending part 412 extends from the second main surface base part 411 toward the first electrically-conductive part 3, in other words, extends from the second main surface base part 411 toward the one side in the x direction. The size of the second main surface extending part 412 in the y direction is smaller than the size of the second main surface base part 411 in the y direction. In the illustrated example, the size of the second main surface extending part 412 in the y direction is equal to or smaller than half the size of the second main surface base part 411 in the y direction. The second main surface extending part 412 leads to the second main surface base part 411 with a bias toward the other side in the y direction. The second main surface part 41 extends from the second coupling part 43 toward the one side in the x direction as viewed in the z direction.

The second back surface part 42 is a part exposed from the insulating back surface 52 of the insulating part 5. It suffices for the second back surface part 42 to be a part exposed from the insulating back surface 52 when the conductive support component 1 is viewed from the other side in the z direction, and the second back surface part 42 may protrude from the insulating back surface 52 toward the other side in the z direction or may be flush with the insulating back surface 52. In the illustrated example, the second back surface part 42 protrudes from the insulating back surface 52 toward the other side in the z direction, and the thickness thereof in the z direction is 0.01 to 0.05 mm, for example.

In the illustrated example, the second back surface part 42 includes a second back surface base part 421 and a second back surface extending part 422. The second back surface base part 421 is a part that overlaps with the second coupling part 43 as viewed in the z direction. The second back surface extending part 422 is a part that extends from the second back surface base part 421 toward the one side in the x direction.

In the present embodiment, the size of the first main surface part 31 and the second main surface part 41 in the z direction is larger than the size of the first back surface part 32 and the second back surface part 42 in the z direction. This relation depends on the manufacturing method of the conductive support component 1, for example. For example, parts that become the first main surface part 31, the second main surface part 41, the first coupling part 33, and the second coupling part 43 are formed by etching a metal plate material from a single surface, and the insulating part 5 is subsequently formed. Then, parts that become the first back surface part 32 and the second back surface part 42 are formed by sputtering, plating, or other methods from the side, in the z direction, opposite to the first main surface part 31 and the second main surface part 41 across the insulating part 5. According to such a manufacturing method, the size (thickness) in the z direction becomes larger (thicker) in the first main surface part 31 and the second main surface part 41, which are parts that have remained in the etching, than in the first back surface part 32 and the second back surface part 42, which are parts formed by the sputtering, plating, or other methods. However, the manufacturing method of the conductive support component 1 is not limited thereto, and various manufacturing methods can be employed.

The second coupling part 43 is located between the second main surface part 41 and the second back surface part 42 in the z direction. The second coupling part 43 is located between the insulating main surface 51 and the insulating back surface 52 of the insulating part 5 in the z direction. The second coupling part 43 couples the second main surface part 41 and the second back surface part 42. The second coupling part 43 overlaps with at least part of the second main surface part 41 and at least part of the second back surface part 42 as viewed in the z direction.

In the illustrated example, the second electrically-conductive part 4 has a recessed part 48. The recessed part 48 is a part that hollows from the other side in the z direction and the other side in the x direction. Due to this, the second back surface part 42 has a shape that hollows from the other side in the x direction as viewed in the z direction.

As illustrated in FIG. 5, FIG. 6, FIG. 10, and FIG. 11, the first main surface extending part 312 of the first main surface part 31 overlaps with the second back surface part 42. In the illustrated example, part of the first main surface extending part 312 overlaps with part of the second back surface extending part 422 of the second back surface part 42 as viewed in the z direction. In FIG. 5 and FIG. 6, hatching is drawn in the part in which the first main surface extending part 312 and the second back surface extending part 422 overlap as viewed in the z direction.

Further, the first main surface extending part 312 and the second main surface extending part 412 overlap as viewed in the y direction. As viewed in the z direction, the first main surface extending part 312 and the second main surface extending part 412 are juxtaposed in the y direction with the interposition of a gap. The first main surface extending part 312 and the second main surface base part 411 are juxtaposed in the x direction with the interposition of a gap. The second main surface extending part 412 and the first main surface base part 311 are juxtaposed in the x direction with the interposition of a gap. The gap between the first main surface part 31 and the second main surface part 41 forms a bent shape as viewed in the z direction.

The first main surface part 31 extends to the other side in the x direction relative to the center of the semiconductor light emitting device A1 (conductive support component 1) in the x direction. The second main surface part 41 is located on the other side in the x direction relative to the center of the semiconductor light emitting device A1 (conductive support component 1) in the x direction.

The second main surface extending part 412 extends to the one side in the x direction relative to the second back surface part 42. The second main surface extending part 412 does not overlap with the first back surface part 32 as viewed in the z direction.

Semiconductor Light Emitting Element 61

The semiconductor light emitting element 61 is a light source of the semiconductor light emitting device A1. The semiconductor light emitting element 61 emits light in a predetermined wavelength region by being supplied with direct-current power. There is no limitation on the specific configuration of the semiconductor light emitting element 61. In the present embodiment, the semiconductor light emitting element 61 has a main body part 610, a first electrode 611, and a second electrode 612 as illustrated in FIG. 1 to FIG. 4. The height of the semiconductor light emitting element 61 in the z direction is 100 to 200 μm, for example.

The main body part 610 contains a GaN-based semiconductor material, a GaAs-based semiconductor material, or other materials and has, for example, a p-type semiconductor layer, an n-type semiconductor layer, and an active layer sandwiched by them. As the light emitted by the main body part 610, for example, blue light, green light, red light, and so forth are cited.

The first electrode 611 and the second electrode 612 are disposed on the one side of the main body part 610 in the z direction. The first electrode 611 and the second electrode 612 contain such metal as aluminum (Al), gold (Au), copper (Cu), or nickel (Ni). For example, one of them is an anode electrode, and the other is a cathode electrode.

The semiconductor light emitting element 61 is mounted on the first main surface part 31 of the first electrically-conductive part 3. In the illustrated example, the main body part 610 is mounted on the first main surface base part 311 of the first main surface part 31. For the mounting of the semiconductor light emitting element 61, for example, a joining material (not illustrated) is used. The joining material may be either an insulating material or an electrically-conductive material. In the illustrated example, the semiconductor light emitting element 61 overlaps with the center of the conductive support component 1 (semiconductor light emitting device A1) in the x direction as viewed in the z direction. Further, the semiconductor light emitting element 61 overlaps with the center of the conductive support component 1 (semiconductor light emitting device A1) in the y direction as viewed in the z direction. The semiconductor light emitting element 61 does not overlap with the first back surface part 32 and the first coupling part 33 as viewed in the z direction.

Zener Diode 62

The Zener diode 62 is an element for avoiding application of an excessive reverse voltage to the semiconductor light emitting element 61. There is no limitation on the specific configuration of the Zener diode 62. As illustrated in FIG. 1 to FIG. 3, in the illustrated example, the Zener diode 62 has a main body part 620, a first electrode 621, and a second electrode 622. The main body part 620 is a part composed of a predetermined semiconductor material. The first electrode 621 is disposed on the one side of the main body part 620 in the z direction. The second electrode 622 is disposed on the other side of the main body part 620 in the z direction.

The Zener diode 62 is disposed on the one side in the x direction relative to the semiconductor light emitting element 61. The Zener diode 62 is mounted on the first main surface part 31 of the first electrically-conductive part 3. In the illustrated example, the Zener diode 62 is mounted on the first main surface base part 311 of the first main surface part 31. Further, the Zener diode 62 overlaps with the first back surface part 32 as viewed in the z direction. Moreover, the Zener diode 62 overlaps with the first coupling part 33 as viewed in the z direction. An electrically-conductive joining material is used for the mounting of the Zener diode 62. The second electrode 622 of the Zener diode 62 is electrically conductively joined to the first main surface base part 311 by the electrically-conductive joining material.

Wire 71

As illustrated in FIG. 1 to FIG. 4, the wire 71 is connected to the first electrode 611 of the semiconductor light emitting element 61. The wire 71 is equivalent to the second wire of the present disclosure. Further, the wire 71 is connected to the second main surface extending part 412 of the second main surface part 41 of the second electrically-conductive part 4. The wire 71 contains gold (Au), for example.

The wire 71 has a first bonding part 711 and a second bonding part 712. The first bonding part 711 is connected to the first electrode 611 of the semiconductor light emitting element 61. The second bonding part 712 is connected to the second main surface extending part 412 of the second main surface part 41 of the second electrically-conductive part 4.

In the illustrated example, a second bonding part 732 of the wire 73 and the first bonding part 711 of the wire 71 are connected to each other on the first electrode 611. More specifically, after the second bonding part 732 of the wire 73 is formed on the first electrode 611, the first bonding part 711 is formed to overlap with the second bonding part 732 as viewed in the z direction. That is, the wire 73 and the wire 71 directly conduct to each other. Further, the first bonding part 711 is connected to the first electrode 611 through the second bonding part 732.

Wire 72

As illustrated in FIG. 1 and FIG. 3, the wire 72 is connected to the second electrode 612 of the semiconductor light emitting element 61. The wire 72 is equivalent to the third wire of the present disclosure. Further, the wire 72 is connected to the first main surface extending part 312 of the first main surface part 31 of the first electrically-conductive part 3. The wire 72 contains gold (Au), for example.

The wire 72 has a first bonding part 721 and a second bonding part 722. The first bonding part 721 is connected to the first main surface extending part 312 of the first main surface part 31 of the first electrically-conductive part 3. The second bonding part 722 is connected to the second electrode 612 of the semiconductor light emitting element 61.

Wire 73

As illustrated in FIG. 1 to FIG. 3, the wire 73 is connected to the first electrode 621 of the Zener diode 62. The wire 73 is equivalent to the first wire of the present disclosure. Further, the wire 73 is connected to the first electrode 611 of the semiconductor light emitting element 61. The wire 73 contains gold (Au), for example.

The wire 73 has a first bonding part 731 and a second bonding part 732. The first bonding part 731 is connected to the first electrode 621 of the Zener diode 62. The second bonding part 732 is connected to the first electrode 611 of the semiconductor light emitting element 61.

Case 8

As illustrated in FIG. 1, the case 8 is a component having a part that surrounds the semiconductor light emitting element 61 and the Zener diode 62 as viewed in the z direction. The case 8 functions as a reflector that causes light from the semiconductor light emitting element 61 to go toward the one side in the z direction, for example. Further, the case 8 is used in order to form a box shape for forming the translucent resin 9. The material of the case 8 is by no means limited to any kind, and an epoxy resin, a silicone resin, or other materials is used as appropriate, for example. Further, a white resin is used in the case of enhancing the reflectance of the case 8.

As illustrated in FIG. 1 to FIG. 4, the case 8 of the present embodiment has a top surface 80, a first outer surface 811, a second outer surface 812, a third outer surface 813, a fourth outer surface 814, a fifth outer surface 815, a first inner surface 821, a second inner surface 822, a third inner surface 823, a fourth inner surface 824, and a fifth inner surface 825. Moreover, the case 8 has a wall part 85.

The top surface 80, the first outer surface 811, the second outer surface 812, the third outer surface 813, the fourth outer surface 814, and the fifth outer surface 815 configure the outer surface of the case 8. The top surface 80 is a surface oriented toward the one side in the z direction, and is a rectangular annular plane orthogonal to the z direction in the illustrated example. The first outer surface 811 is a surface oriented toward the one side in the x direction, and is a plane orthogonal to the x direction in the illustrated example. The second outer surface 812 is a surface oriented toward the other side in the x direction, and is a plane orthogonal to the x direction in the illustrated example. The third outer surface 813 is a surface oriented toward the other side in the y direction, and is a plane orthogonal to the y direction in the illustrated example. The fourth outer surface 814 is a surface oriented toward the one side in the y direction, and is a plane orthogonal to the y direction in the illustrated example. The fifth outer surface 815 intervenes between the first outer surface 811 and the fourth outer surface 814, and is inclined with respect to the x direction and the y direction.

The first inner surface 821, the second inner surface 822, the third inner surface 823, the fourth inner surface 824, and the fifth inner surface 825 configure the inside surface of the case 8. The first inner surface 821 is a surface oriented toward the other side in the x direction, and is a plane slightly inclined with respect to the x direction and the z direction in the illustrated example. The second inner surface 822 is a surface oriented toward the one side in the x direction, and is a plane slightly inclined with respect to the x direction and the z direction in the illustrated example. The third inner surface 823 is a surface oriented toward the one side in the y direction, and is a plane slightly inclined with respect to the y direction and the z direction in the illustrated example. The fourth inner surface 824 is a surface oriented toward the other side in the y direction, and is a plane slightly inclined with respect to the y direction and the z direction in the illustrated example. The fifth inner surface 825 intervenes between the first inner surface 821 and the fourth inner surface 824, and is inclined with respect to the x direction, the y direction, and the z direction.

The wall part 85 is located between the semiconductor light emitting element 61 and the Zener diode 62 as viewed in the z direction. The wall part 85 is in contact with the first main surface part 31 of the first electrically-conductive part 3 and protrudes from the first main surface part 31 toward the one side in the z direction. The wall part 85 has a shape extending along the y direction. In the illustrated example, the wall part 85 leads to the third inner surface 823 and the fourth inner surface 824.

There is no limitation on the size of the wall part 85. In the illustrated example, the size of the wall part 85 in the z direction from the first main surface part 31 is larger than the size of the Zener diode 62 in the z direction from the first main surface part 31. Further, in the illustrated example, the size of the wall part 85 in the z direction from the first main surface part 31 is larger than the size of the semiconductor light emitting element 61 in the z direction from the first main surface part 31. The size of the wall part 85 in the z direction is 110 to 300 μm, for example. The size of the semiconductor light emitting element 61 in the z direction is 100 to 200 μm, for example. The size of the Zener diode 62 in the z direction is 100 to 200 μm, for example. The wire 73 is disposed to straddle the wall part 85.

Translucent Resin 9

As illustrated in FIG. 2 to FIG. 4, a region defined by the conductive support component 1 and the case 8 is filled with the translucent resin 9. The translucent resin 9 fulfills a function of protecting the semiconductor light emitting element 61 and the Zener diode 62, for example. The translucent resin 9 contains an epoxy resin, a silicone resin, or other materials having translucency, for example. The translucent resin 9 may be either transparent or semitransparent. The translucent resin 9 may contain a fluorescent material. In this case, the fluorescent material is excited by light emitted from the translucent resin 9 and thereby emits light in a wavelength region different from that of light from the translucent resin 9. Due to this color mixing effect, for example, the semiconductor light emitting device A1 emits white light through emission of blue light by the semiconductor light emitting element 61 and emission of yellow light from the fluorescent material.

Next, operation of the semiconductor light emitting device A1 will be described.

In the present embodiment, as illustrated in FIG. 1 and FIG. 2, the wire 73 is connected to the first electrode 611 of the semiconductor light emitting element 61. The first electrode 611 is connected to the wire 71. The wire 71 is connected to the second electrically-conductive part 4. Thus, the first electrode 621 of the Zener diode 62 conducts to the second electrically-conductive part 4 through the wire 73, the first electrode 611, and the wire 71. In a configuration in which the wire 73 is connected to the first electrode 611 of the semiconductor light emitting element 61 and the second electrically-conductive part 4 unlike in the present embodiment, the wire 73 is present directly above the semiconductor light emitting element 61 in the z direction in such a manner as to traverse the semiconductor light emitting element 61 in addition to the wire 71 and the wire 72 illustrated in FIG. 1. In such a configuration, light from the semiconductor light emitting element 61 is significantly interrupted by the wire 73. Further, the wire 73 and the wire 71 need to be connected to the second electrically-conductive part 4, and therefore, the second electrically-conductive part 4 is forced to be enlarged. This causes size increase of the semiconductor light emitting device A1. According to the present embodiment, as viewed in the z direction, the wire 73 does not have such a form as to traverse the semiconductor light emitting element 61, and only part of the wire 73 overlaps with the semiconductor light emitting element 61. This can suppress interruption of light from the semiconductor light emitting element 61 by the wire 73. Moreover, because the wire 73 is not connected to the second electrically-conductive part 4, enlargement of the second electrically-conductive part 4 can be avoided. Therefore, size reduction and increase in the luminance for the semiconductor light emitting device A1 can be sought.

The wire 73 and the wire 71 are connected to each other on the first electrode 611. This can reduce the area occupied by the wire 73 and the wire 71 on the first electrode 611 while connecting the wire 73 and the wire 71 to the first electrode 611. This is preferable for size reduction of the semiconductor light emitting element 61 and hence size reduction of the semiconductor light emitting device A1.

The second bonding part 732 of the wire 73 is connected to the first electrode 611, and the first bonding part 711 of the wire 71 is connected to the second bonding part 732. In such a form, in the formation of the first bonding part 711, an effect that the second bonding part 732 is connected to the first electrode 611 more firmly is provided.

As illustrated in FIG. 5, FIG. 6, FIG. 10, and FIG. 11, the first main surface extending part 312 overlaps with the second back surface part 42 as viewed in the z direction. This can allow the second back surface part 42 to have a shape that projects to a larger extent toward the one side in the x direction (right side in the drawings of FIG. 10 and FIG. 11) while the first main surface part 31 is extended toward the other side in the x direction (left side in the drawings of FIG. 10 and FIG. 11). This can sufficiently reserve, in the first main surface part 31, the region in which the semiconductor light emitting element 61 and the Zener diode 62 are mounted and the region to which the wire 72 is connected, while avoiding increase in the size of the whole of the semiconductor light emitting device A1. Further, it is possible to form the second back surface part 42 with a size sufficient to mount the semiconductor light emitting device A1 on a circuit board, for example, while avoiding increase in the size of the whole of the semiconductor light emitting device A1. Therefore, size reduction of the semiconductor light emitting device A1 can be sought.

The first main surface part 31 has the first main surface extending part 312. The first main surface extending part 312 extends to the other side in the x direction relative to the semiconductor light emitting element 61. The first main surface extending part 312 is preferable as the part to which the wire 72 is to be connected.

The second main surface part 41 has the second main surface extending part 412. The second main surface extending part 412 extends toward the one side in the x direction. The second main surface extending part 412 is preferable as the part to which the wire 71 is to be connected.

The first main surface extending part 312 has a smaller size in the y direction than the first main surface base part 311, and the second main surface extending part 412 has a smaller size in the y direction than the second main surface base part 411. Further, the first main surface extending part 312 and the second main surface extending part 412 overlap as viewed in the y direction. This can reduce the size of the semiconductor light emitting device A1 in the x direction while reserving the parts to which the wire 71 and the wire 72 are connected.

The first main surface extending part 312 leads to the first main surface base part 311 with a bias toward the one side in the y direction. The second main surface extending part 412 leads to the second main surface base part 411 with a bias toward the other side in the y direction. Such a configuration is preferable for causing the first main surface extending part 312 and the second main surface extending part 412 to overlap as viewed in the y direction.

As illustrated in FIG. 1 to FIG. 3, the case 8 has the wall part 85. The wall part 85 is located between the semiconductor light emitting element 61 and the Zener diode 62 as viewed in the z direction. This can suppress absorption of light from the semiconductor light emitting element 61 by the Zener diode 62. Therefore, increase in the luminance of the semiconductor light emitting device A1 can be sought.

The wall part 85 leads to the third inner surface 823 and the fourth inner surface 824. This can further suppress absorption of light from the semiconductor light emitting element 61 by the Zener diode 62.

The size of the wall part 85 in the z direction is larger than the size of the Zener diode 62 in the z direction. This is preferable for suppression of absorption of light from the semiconductor light emitting element 61 by the Zener diode 62. Further, the size of the wall part 85 in the z direction is larger than the size of the semiconductor light emitting element 61 in the z direction. This is preferable for suppression of absorption of light from the semiconductor light emitting element 61 by the Zener diode 62.

FIG. 12 to FIG. 19 illustrate modification examples and another embodiment of the present disclosure. In these diagrams, the same or similar elements as the above-described embodiment are given the same numerals as those in the above-described embodiment. Further, the configurations of the parts in the modification examples and the embodiments can be combined with each other as appropriate in a range in which technical contradiction is not caused.

First Modification Example of First Embodiment

Figure 12:
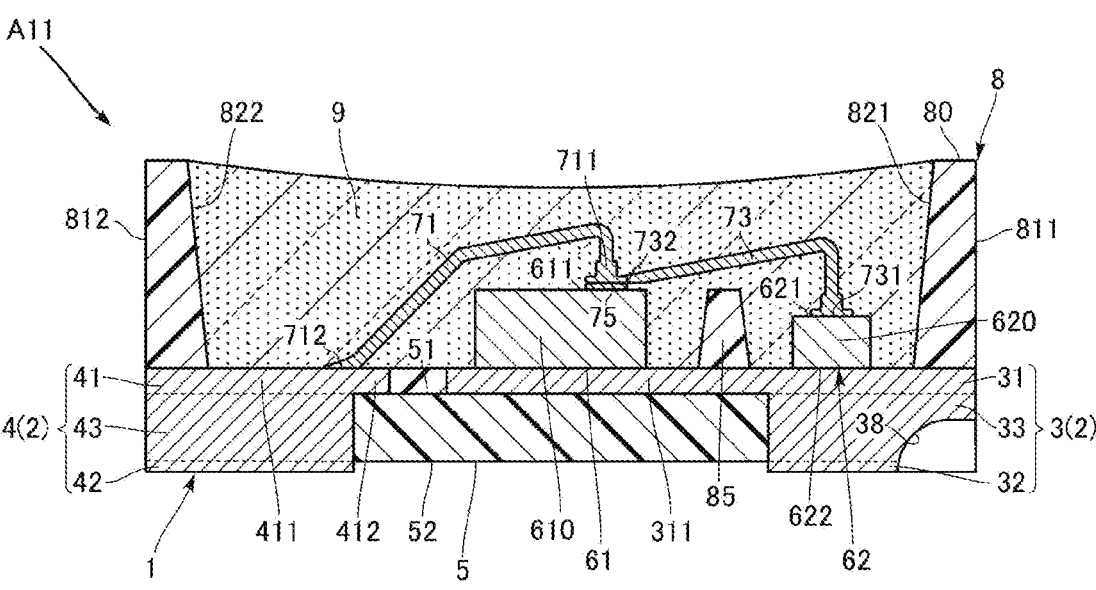
FIG. 12 is a sectional view illustrating a first modification example of the semiconductor light emitting device according to the first embodiment of the present disclosure.
Figure 12:
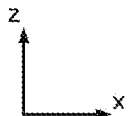
Figure 13:
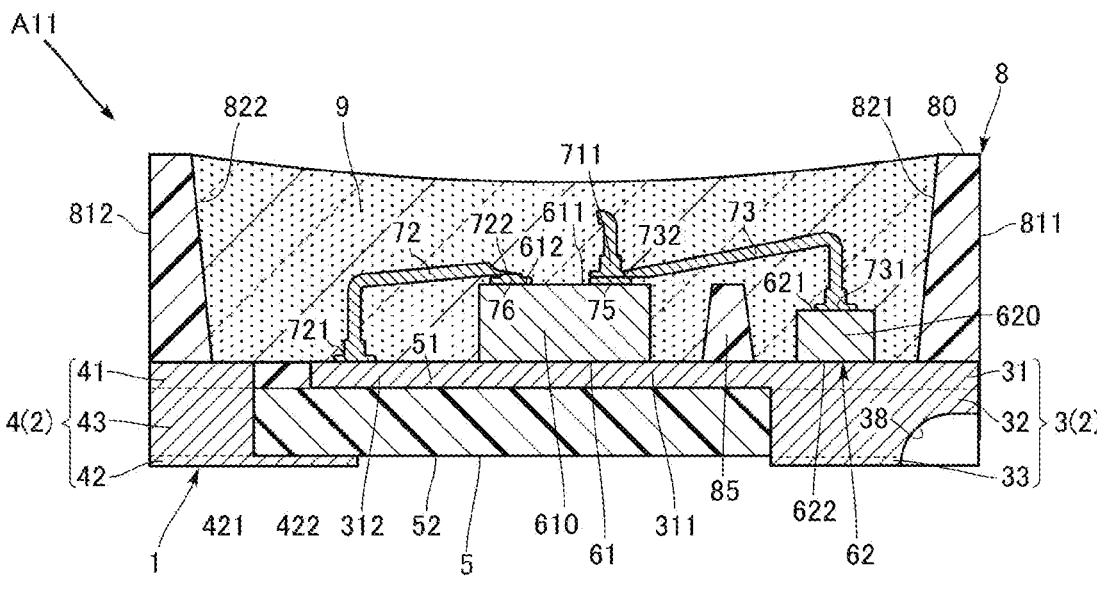
FIG. 13 is a sectional view illustrating the first modification example of the semiconductor light emitting device according to the first embodiment of the present disclosure.
Figure 13:
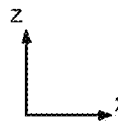

FIG. 12 and FIG. 13 each illustrate a first modification example of the semiconductor light emitting device A1. A semiconductor light emitting device A11 of the present modification example has a sub-bonding part 75 and a sub-bonding part 76.

As illustrated in FIG. 12, the sub-bonding part 75 intervenes between the first electrode 611 and the second bonding part 732. Such a sub-bonding part 75 is formed by, for example, causing a metal material melted from a capillary for forming the wire 73 to adhere to the first electrode 611 prior to formation of the second bonding part 732. After the sub-bonding part 75 is formed, the second bonding part 732 is formed on the sub-bonding part 75, and further, the first bonding part 711 is formed on the second bonding part 732.

As illustrated in FIG. 13, the sub-bonding part 76 intervenes between the second electrode 612 and the second bonding part 722. Such a sub-bonding part 76 is formed by, for example, causing a metal material melted from a capillary for forming the wire 72 to adhere to the second electrode 612 prior to formation of the second bonding part 722. After the sub-bonding part 76 is formed, the second bonding part 722 is formed on the sub-bonding part 76.

Also by such a modification example, effects similar to those of the above-described semiconductor light emitting device A1 are provided. Further, owing to the sub-bonding part 75 being disposed, a force loaded on the semiconductor light emitting element 61 when the second bonding part 732 is formed can be reduced. Moreover, owing to the sub-bonding part 76 being disposed, a force loaded on the semiconductor light emitting element 61 when the second bonding part 722 is formed can be reduced. These configurations are preferable for protection of the semiconductor light emitting element 61.

Second Modification Example of First Embodiment

Figure 14:
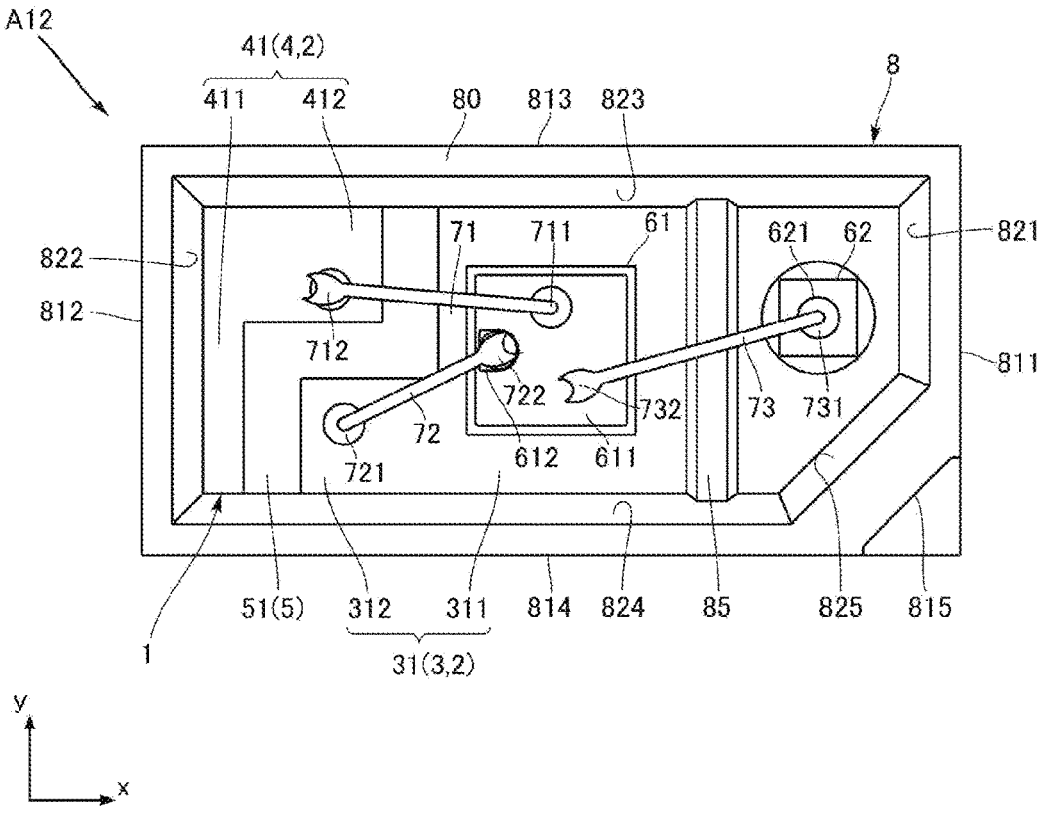
FIG. 14 is a plan view illustrating a second modification example of the semiconductor light emitting device according to the first embodiment of the present disclosure.

FIG. 14 illustrates a second modification example of the semiconductor light emitting device A1. In a semiconductor light emitting device A12 of the present modification example, the second bonding part 732 of the wire 73 and the first bonding part 711 of the wire 71 are separate from each other on the first electrode 611. There is no limitation on the positional relation between the second bonding part 732 and the first bonding part 711. In the illustrated example, the second bonding part 732 and the first bonding part 711 are separate from each other in the y direction.

Also by the present modification example, effects similar to those of the semiconductor light emitting device A1 are provided. Further, the second bonding part 732 (wire 73) and the first bonding part 711 (wire 71) conduct to each other through the first electrode 611. Thus, the wire 73 does not need to be formed to traverse the semiconductor light emitting element 61 also in the semiconductor light emitting device A12.

Third Modification Example of First Embodiment

Figure 15:
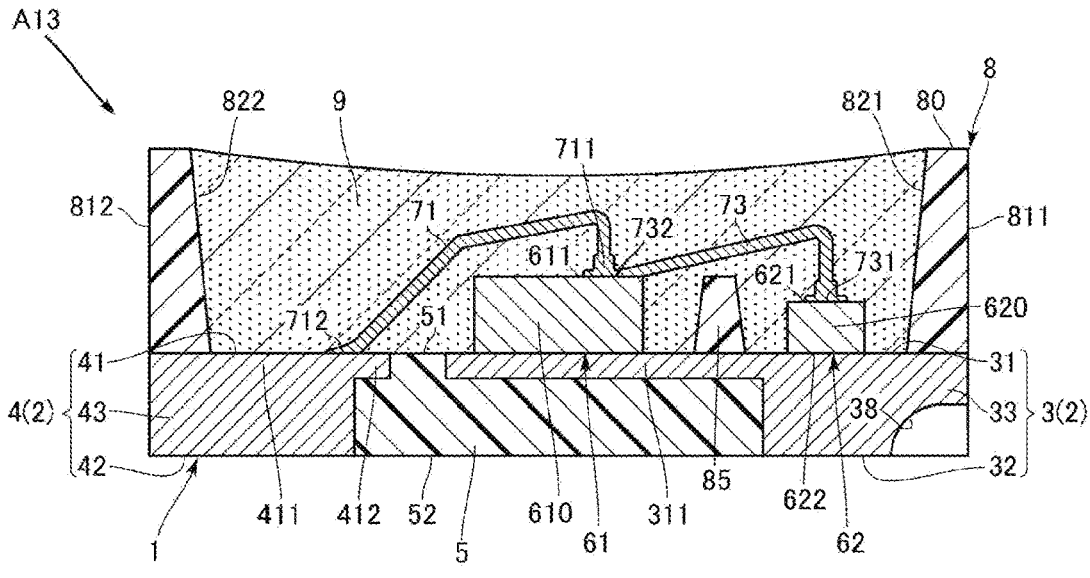
FIG. 15 is a sectional view illustrating a third modification example of the semiconductor light emitting device according to the first embodiment of the present disclosure.
Figure 15:
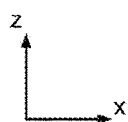

FIG. 15 illustrates a third modification example of the semiconductor light emitting device A1. In a semiconductor light emitting device A13 of the present modification example, the configuration of the electrically-conductive part 2 and the insulating part 5 of the conductive support component 1 is different from that in the above-described example.

In the electrically-conductive part 2 of the present modification example, the first electrically-conductive part 3 and the second electrically-conductive part 4 do not protrude from the insulating main surface 51 and the insulating back surface 52 of the insulating part 5. Thus, the first main surface part 31 of the present modification example is configured by the surface exposed from the insulating main surface 51 in the first electrically-conductive part 3. Further, the second main surface part 41 is configured by the surface exposed from the insulating main surface 51 in the second electrically-conductive part 4. The first back surface part 32 is configured by the surface exposed from the insulating back surface 52 in the first electrically-conductive part 3, and the second back surface part 42 is configured by the surface exposed from the insulating back surface 52 in the second electrically-conductive part 4.

Also by such a modification example, effects similar to those of the semiconductor light emitting device A1 are provided. Further, as is understood from the present modification example, the first main surface part 31, the first back surface part 32, the second main surface part 41, and the second back surface part 42 may each have such a configuration as to protrude from the insulating main surface 51 and the insulating back surface 52 or may each have such a configuration as to be flush with the insulating main surface 51 and the insulating back surface 52.

Second Embodiment

Figure 16:
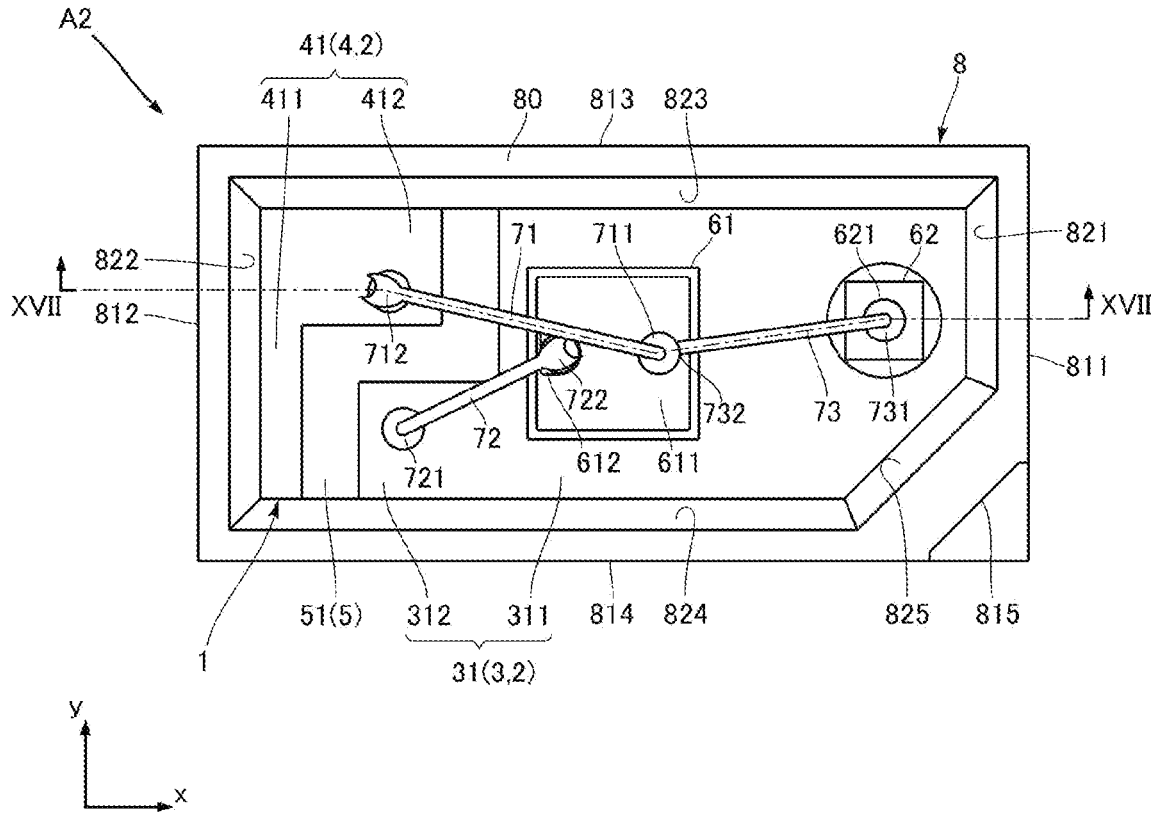
FIG. 16 is a plan view illustrating a semiconductor light emitting device according to a second embodiment of the present disclosure.
Figure 17:
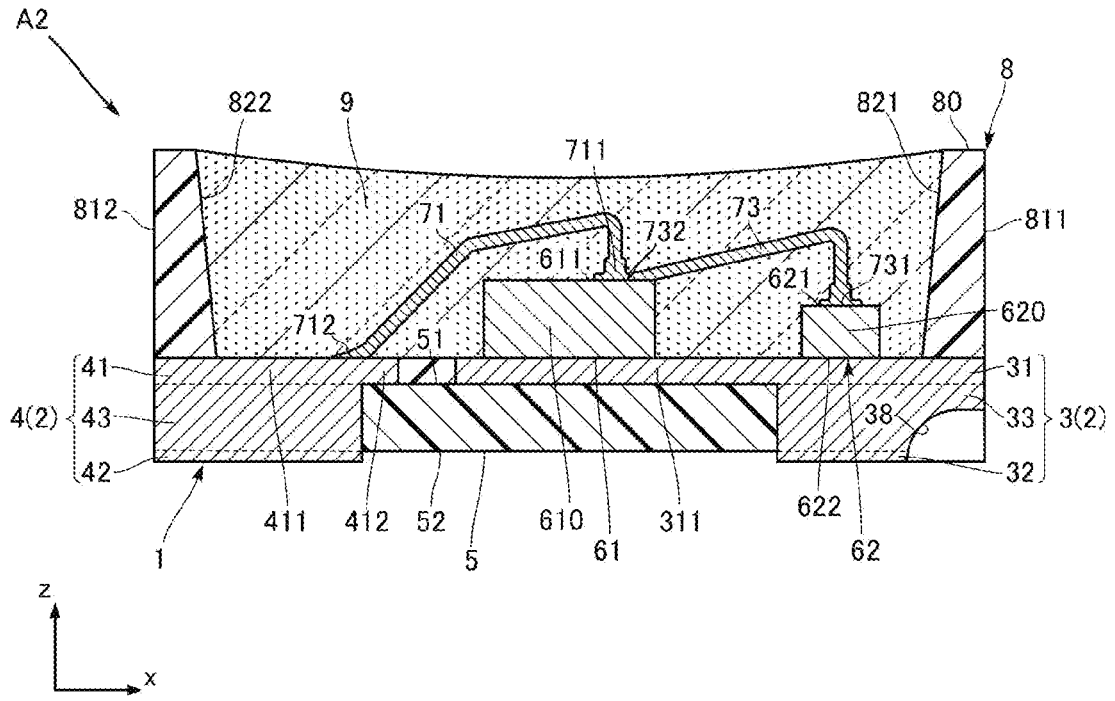
FIG. 17 is a sectional view taken along line XVII-XVII in FIG. 16.

FIG. 16 and FIG. 17 each illustrate a semiconductor light emitting device according to a second embodiment of the present disclosure. In a semiconductor light emitting device A2 of the present embodiment, the configuration of the case 8 is different from the case 8 of the above-described semiconductor light emitting device A1.

The case 8 of the present embodiment does not have the wall part 85. Thus, the wire 73 does not have such a form as to straddle the wall part 85.

Also by such an embodiment, effects similar to those of the semiconductor light emitting device A1 are provided except for effects relating to the wall part 85. Further, there is no limitation on the specific configuration of the case 8 as is understood from the present embodiment. As a result of the absence of the wall part 85, for example, there is an advantage that the region surrounded by the case 8 can be more smoothly filled with a resin material when the translucent resin 9 is formed.

First Modification Example of Second Embodiment

FIG. 18 and FIG. 19 each illustrate a first modification example of the semiconductor light emitting device A2. In a semiconductor light emitting device A21 of the present modification example, the configuration of the conductive support component 1 is different from that of the above-described embodiment.

In the present modification example, the second back surface part 42 does not have the above-described second back surface extending part 422. That is, the whole of the second back surface part 42 overlaps with the second coupling part 43 as viewed in the z direction. Thus, the first main surface part 31 does not overlap with the second back surface part 42 as viewed in the z direction.

Also by such an embodiment, effects similar to those of the semiconductor light emitting device A2 are provided except for effects relating to overlapping of the first main surface part 31 and the second back surface part 42. Further, there is no limitation on the relation between the first electrically-conductive part 3 (first main surface part 31) and the second electrically-conductive part 4 (second back surface part 42) as is understood from the present modification example.

The semiconductor light emitting device according to the present disclosure is not limited to the above-described embodiments. The design of the specific configurations of the parts of the semiconductor light emitting device according to the present disclosure can be changed variously and freely.

Supplementary Note 1

A semiconductor light emitting device including:
a semiconductor light emitting element;

a Zener diode; and
a conductive support component that supports the semiconductor light emitting element and the Zener diode, in which
the semiconductor light emitting element has a first electrode, and
the semiconductor light emitting device further includes a first wire connected to the Zener diode and the first electrode.

Supplementary Note 2

The semiconductor light emitting device according to supplementary note 1, further including:
a second wire connected to the first electrode.

Supplementary Note 3

The semiconductor light emitting device according to supplementary note 2, in which
the first wire and the second wire are connected to each other on the first electrode.

Supplementary Note 4

The semiconductor light emitting device according to supplementary note 2 or 3, in which
a second bonding part of the first wire is connected to the first electrode.

Supplementary Note 5

The semiconductor light emitting device according to supplementary note 4, in which
a first bonding part of the first wire is connected to the Zener diode.

Supplementary Note 6

The semiconductor light emitting device according to supplementary note 4 or 5, in which
a first bonding part of the second wire is connected to the first electrode.

Supplementary Note 7

The semiconductor light emitting device according to any one of supplementary notes 4 to 6, in which
the first wire is connected to the first electrode through a sub-bonding part.

Supplementary Note 8

The semiconductor light emitting device according to supplementary note 2, in which
the first wire and the second wire are separate from each other on the first electrode.

Supplementary Note 9

The semiconductor light emitting device according to any one of supplementary notes 2 to 8, in which
the conductive support component includes an electrically-conductive part and an insulating part,
the electrically-conductive part includes a first electrically-conductive part and a second electrically-conductive part insulated from each other with interposition of the insulating part, and the semiconductor light emitting element is mounted on the first electrically-conductive part.

Supplementary Note 10

The semiconductor light emitting device according to supplementary note 9, in which
the second electrically-conductive part is disposed on a side opposite to the Zener diode across the semiconductor light emitting element.

Supplementary Note 11

The semiconductor light emitting device according to supplementary note 10, in which
the insulating part has an insulating main surface and an insulating back surface oriented toward sides opposite to each other in a thickness direction,
the first electrically-conductive part includes a first main surface part exposed from the insulating main surface,
the second electrically-conductive part includes a second back surface part exposed from the insulating back surface,
the first main surface part includes a first main surface base part on which the semiconductor light emitting element is mounted and a first main surface extending part extending from the first main surface base part in a first direction orthogonal to the thickness direction, and
the first main surface extending part overlaps with the second back surface part as viewed in the thickness direction.

Supplementary Note 12

The semiconductor light emitting device according to supplementary note 11, in which
the first electrically-conductive part further includes a first back surface part exposed from the insulating back surface and a first coupling part located between the first main surface part and the first back surface part in the thickness direction, and
the second electrically-conductive part further includes a second main surface part exposed from the insulating main surface and a second coupling part located between the second main surface part and the second back surface part in the thickness direction.

Supplementary Note 13

The semiconductor light emitting device according to supplementary note 12, in which
the second main surface part further includes a second main surface base part and a second main surface extending part, and
the second main surface extending part extends from the second main surface base part toward the first electrically-conductive part in the first direction.

Supplementary Note 14

The semiconductor light emitting device according to supplementary note 13, in which
the second wire is connected to the second main surface extending part.

Supplementary Note 15

The semiconductor light emitting device according to supplementary note 14, in which the semiconductor light emitting element further includes a second electrode, and the semiconductor light emitting device further includes a third wire connected to the second electrode and the first main surface extending part.

Supplementary Note 16

The semiconductor light emitting device according to supplementary note 15, in which the first main surface extending part and the second main surface extending part overlap as viewed in a second direction orthogonal to the thickness direction and the first direction.

Supplementary Note 17

The semiconductor light emitting device according to supplementary note 16, in which the first main surface extending part leads to the first main surface base part with a bias toward one side in the second direction, and the second main surface extending part leads to the second main surface base part with a bias toward the other side in the second direction.

What is claimed is:

1. A semiconductor light emitting device comprising:

a semiconductor light emitting element;

a Zener diode; and a conductive support component that supports the semiconductor light emitting element and the Zener diode, wherein the conductive support component includes an electrically-conductive part and an insulating part, the electrically-conductive part includes a first electrically-conductive part and a second electrically-conductive part, the first electrically-conductive part is insulated from the second electrically-conductive part with interposition of the insulating part, the insulating part has an insulating main surface and an insulating back surface oriented toward opposite sides in a thickness direction, the first electrically-conductive part includes a first main surface part exposed from the insulating main surface, the semiconductor light emitting element is mounted on the first electrically-conductive part, the second electrically-conductive part is disposed on a side opposite to the Zener diode across the semiconductor light emitting element, the second electrically-conductive part includes a second back surface part exposed from the insulating back surface, the first main surface part includes a first main surface base part on which the semiconductor light emitting element is mounted and a first main surface extending part extending from the first main surface base part in a first direction orthogonal to the thickness direction, the first main surface extending part overlaps with the second back surface part as viewed in the thickness direction, the semiconductor light emitting element has a first electrode, and the semiconductor light emitting device further includes:

a first wire connected to the Zener diode and the first electrode; and a second wire connected to the first electrode.

2. The semiconductor light emitting device according to claim 1, wherein the first wire is connected to the second wire on the first electrode.

3. The semiconductor light emitting device according to claim 1, wherein a second bonding part of the first wire is connected to the first electrode.

4. The semiconductor light emitting device according to claim 3, wherein a first bonding part of the first wire is connected to the Zener diode.

5. The semiconductor light emitting device according to claim 3, wherein a first bonding part of the second wire is connected to the first electrode.

6. The semiconductor light emitting device according to claim 3, wherein the first wire is connected to the first electrode through a sub-bonding part.

7. The semiconductor light emitting device according to claim 1, wherein the first wire and the second wire are separate from each other on the first electrode.

8. The semiconductor light emitting device according to claim 1, wherein the first electrically-conductive part further includes a first back surface part exposed from the insulating back surface and a first coupling part located between the first main surface part and the first back surface part in the thickness direction, and the second electrically-conductive part further includes a second main surface part exposed from the insulating main surface and a second coupling part located between the second main surface part and the second back surface part in the thickness direction.

9. The semiconductor light emitting device according to claim 8, wherein the second main surface part further includes a second main surface base part and a second main surface extending part, and the second main surface extending part extends from the second main surface base part toward the first electrically-conductive part in the first direction.

10. The semiconductor light emitting device according to claim 9, wherein the second wire is connected to the second main surface extending part.

11. The semiconductor light emitting device according to claim 10, wherein the semiconductor light emitting element further includes a second electrode, and the semiconductor light emitting device further includes a third wire connected to the second electrode and the first main surface extending part.

12. The semiconductor light emitting device according to claim 11, wherein the first main surface extending part and the second main surface extending part overlap as viewed in a second direction orthogonal to the thickness direction and the first direction.

* * * * *